United States Patent
Schoepf et al.

(10) Patent No.: US 9,212,932 B2
(45) Date of Patent: Dec. 15, 2015

(54) METHOD FOR IDENTIFYING CONSUMERS AND PRODUCERS IN A PNEUMATIC, HYDRAULIC, OR ELECTRICAL NETWORK

(75) Inventors: Friedrich Schoepf, Sternenfels-Diefenbach (DE); Markus Brandstetter, Sachsenheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 637 days.

(21) Appl. No.: 13/522,658

(22) PCT Filed: Dec. 14, 2010

(86) PCT No.: PCT/EP2010/069603
§ 371 (c)(1),
(2), (4) Date: Oct. 19, 2012

(87) PCT Pub. No.: WO2011/091906
PCT Pub. Date: Aug. 4, 2011

(65) Prior Publication Data
US 2013/0054039 A1  Feb. 28, 2013

(30) Foreign Application Priority Data
Jan. 26, 2010  (DE) .......................... 10 2010 001 198

(51) Int. Cl.
*G01D 4/00*  (2006.01)
*G01R 19/25*  (2006.01)

(52) U.S. Cl.
CPC ............ *G01D 4/002* (2013.01); *G01R 19/2513* (2013.01); *Y02B 90/241* (2013.01); *Y04S 20/32* (2013.01); *Y04S 20/38* (2013.01)

(58) Field of Classification Search
USPC .......................................... 700/286, 293, 291
See application file for complete search history.

(56) References Cited

U.S. PATENT DOCUMENTS

| 4,858,141 A | 8/1989 | Hart et al. |
| 5,483,153 A | 1/1996 | Leeb et al. |
| 8,447,541 B2 * | 5/2013 | Rada et al. ..................... 702/60 |
| 8,463,425 B2 * | 6/2013 | Hanel ........................... 700/215 |
| 8,649,987 B2 * | 2/2014 | Steenberg et al. ............. 702/61 |
| 2005/0171645 A1 * | 8/2005 | Oswald et al. ................ 700/276 |

(Continued)

FOREIGN PATENT DOCUMENTS

| CN | 1908677 | 2/2007 |
| CN | 101509949 | 8/2009 |

(Continued)

OTHER PUBLICATIONS

International Search Report for PCT/EP2010/069603, dated Aug. 26, 2011.

(Continued)

*Primary Examiner* — Kidest Bahta
(74) *Attorney, Agent, or Firm* — Kenyon & Kenyon LLP

(57) ABSTRACT

In a method for identifying consumers in a pneumatic, hydraulic, or electrical network, a control unit detects connection and disconnection processes of the consumers, and the connection and disconnection processes are associated with the consumers. Comparative profiles of consumers are stored in the central control unit, each detected connection and disconnection process is compared with the stored comparative profiles, and the detected connection and disconnection process is associated with a certain consumer at least with a certain probability.

8 Claims, 3 Drawing Sheets

(56) References Cited

U.S. PATENT DOCUMENTS

2010/0176778 A1* 7/2010 Lin et al. ........................ 323/282
2011/0010785 A1* 1/2011 DiFede et al. .................... 800/14
2011/0251807 A1* 10/2011 Rada et al. ....................... 702/61

FOREIGN PATENT DOCUMENTS

| EP | 2 026 299 | 2/2009 |
|---|---|---|
| JP | 2001-330630 | 11/2001 |
| JP | 2002-279572 | 9/2002 |
| JP | 2003-333768 | 11/2003 |
| JP | 2004-222375 | 8/2004 |
| JP | 2009-168566 | 7/2009 |
| WO | WO 2009/103998 | 8/2009 |

OTHER PUBLICATIONS

Hart, G W: "Nonintrusive Appliance Load Monitoring", proceedings of the IEEE, IEEE, New York, U.S. Bd. 80, Nr. 12, Dec. 1, 1992, pp. 1870-1891.

* cited by examiner

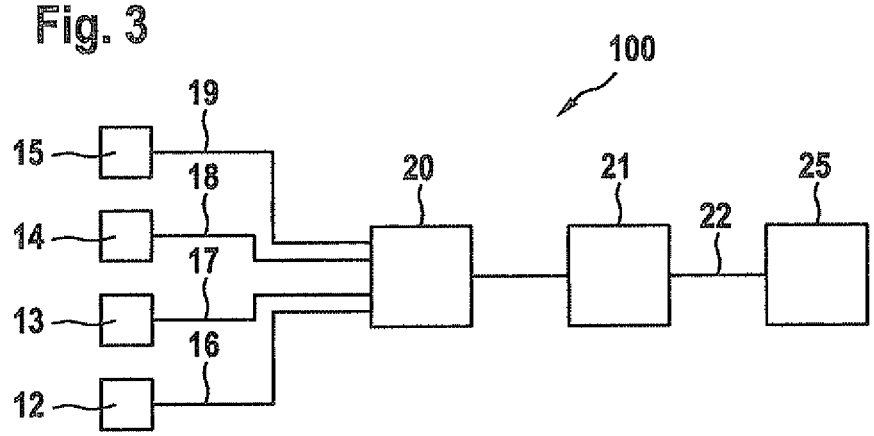
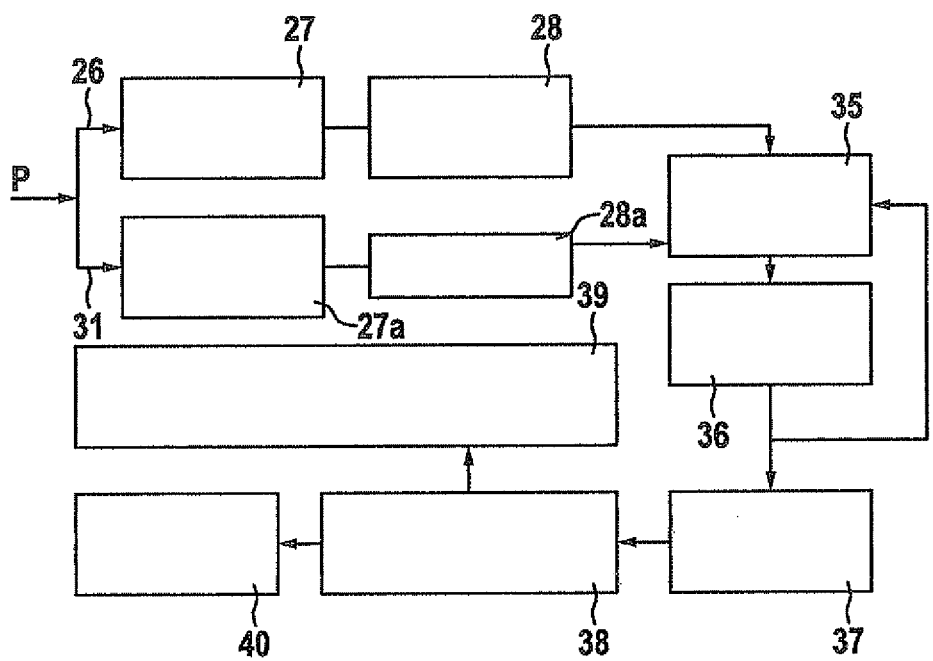

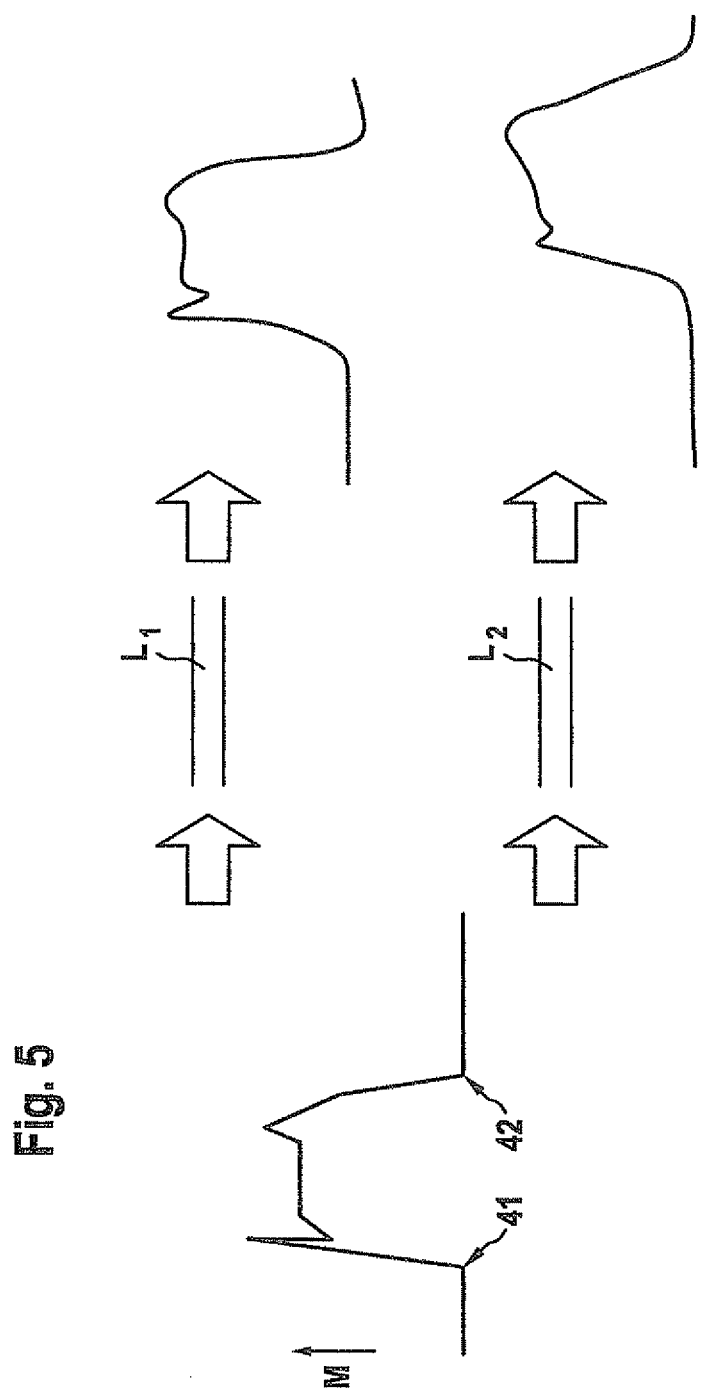

METHOD FOR IDENTIFYING CONSUMERS AND PRODUCERS IN A PNEUMATIC, HYDRAULIC, OR ELECTRICAL NETWORK

BACKGROUND OF THE INVENTION

1. Field of the Invention

The present invention relates to a method for identifying consumers and producers in a pneumatic, hydraulic, or electrical.

2. Description of the Related Art

The total power consumption of electric consumers in electric networks is detected and plotted over time, for example, with the aid of a central control unit. In the case of electric consumers, these may be electric devices or machines, for example, which are situated in a factory building at different locations. The use and the connection or disconnection of the electric devices or machines is often automated. If it is now desired to minimize the total energy demand of the building or the system, it is important to know when and which device or machine is being connected or disconnected. It is then often to determine that machines or devices are connected, although they are not being used. This is to be determined, for example when devices work on weekends or on holidays, although no user needs the devices.

In the related art, while the power consumption of a total number of electric devices or machines in a network is detected with the aid of the central control unit, individual devices or machines are not easily associated with the power curve or with power peaks. Therefore, in the related art, this is done via site inspections by qualified personnel, which gains an overview of the devices and machines being used and attempts to associate the power consumption curve of the entire system with the individual devices or machines.

This is made difficult, for example by the fact that the individual electric devices or machines are easily accessible only at certain times (e.g. business days and then only during the day); otherwise this is sometimes associated with extra costs, which may be significant.

BRIEF SUMMARY OF THE INVENTION

An object of the present invention is to refine a method for identifying consumers or producers in a pneumatic, hydraulic, or electrical network in such a way that the pneumatic, hydraulic, or electrical consumers in the network are at least largely automatically identified. The present invention results in a simplification of the overall energy management of a network since, due to the automated identification, for example, of the individual consumers, their connection characteristics may be determined and influenced in a simple manner. The present invention is based on the idea of storing comparative profiles of consumers and producers, together with their characteristic connection and disconnection processes, in the central control unit and comparing these stored profiles with the actually occurring profiles, so that the actual profiles may be associated with specific consumers with a certain probability.

Advantageous refinements of the method according to the present invention for identifying consumers and producers in a pneumatic, hydraulic, or electrical network are described in the subclaims. Any combinations of at least two of the features disclosed in the claims, the description, or the figures fall within the scope of the present invention.

In particular, it is provided that during the connection and disconnection process of the consumer and the producer, the time curve of a measured value, in particular of a current or a voltage, a power consumption or a pneumatic or hydraulic pressure, or a volume flow is detected. Important here is only that the measured value is suitable for reliably recognizing a connection and disconnection process of a consumer and a producer as much as possible for associating the measured values with a certain consumer and producer with the help of the measured value.

It is also advantageous in particular if a conclusion is drawn regarding a spatial distance to a measured value recording unit on the basis of the curve of the measured value. Due to the fact that a conclusion may be drawn regarding a spatial distance to a measured value recording unit, the individual connection and disconnection processes are relatively easily associated with a certain consumer and producer. The association is important because only on the basis of the association may it be decided whether, for example a connection and disconnection process of the consumer and the producer is necessary or required at a certain point in time.

In another embodiment of the present invention, it may be provided that in the event of a deviation of the actually detected time curve of the measured value from the time curves stored in the central control unit, the actually detected time curve is associated with a specific consumer and producer on the basis of probability criteria. The identification method thus becomes less sensitive to interfering influences and may easily adapt to the actual circumstances, for example in the event of (slight) variations over time of the consumer and the producer, for example as a result of aging or tolerances.

For the evaluation of the representation of the detected measured values, so they may be correctly interpreted by an energy consultant, for example, it is also advantageous if the central control unit is coupled to at least one output unit, which displays at least the time curve of the detected connection and disconnection processes, and the consumers and producers associated with the connection and disconnection processes.

In particular, in the case of a new installation or when the method is run for the first time, it is also advantageous in particular if the characteristic quantities of known consumers and producers are specified for the central control unit via an input unit, and are used by the control unit for performing the comparison with the actually detected time curves of the measured values or used as an additional database for verifying consumers and producers. This allows the consumers and producers to be identified particularly quickly and reliably.

In particular when installing the central control unit, it is also advantageous if the central control unit is calibrated with the aid of a known calibrating device and a known distance. This increases the accuracy of the detected measured values and the probability of correctly associating the measured value curves with the individual consumers and producers.

BRIEF DESCRIPTION OF THE DRAWINGS

FIG. 3 shows a simplified illustration of an electric network.

FIG. 4 shows a flow chart for illustrating the method according to the present invention.

FIG. 5 shows an illustration for explaining the different measured value time curves for one and the same device for different line lengths.

DETAILED DESCRIPTION OF THE INVENTION

Figure 1:
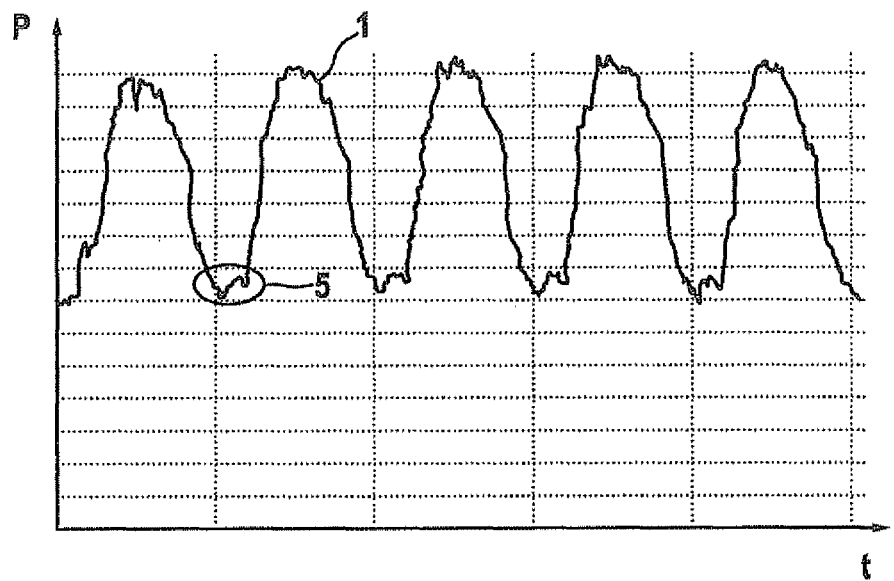
FIG. 1 shows an illustration of the power consumption in an electric network during several days.

In FIG. 1, curve 1 shows the variation of power consumption P over time t in an electric network, a plurality of consumers being components of the electric network. The curve over a total time period of five days is shown here, including the particular power maximums around noon and power minimums during the night hours. As is apparent from region 5 of curve 1, during the night hours multiple connection and disconnection processes of consumers were registered, which result in power peaks and power minimums.

Figure 2:
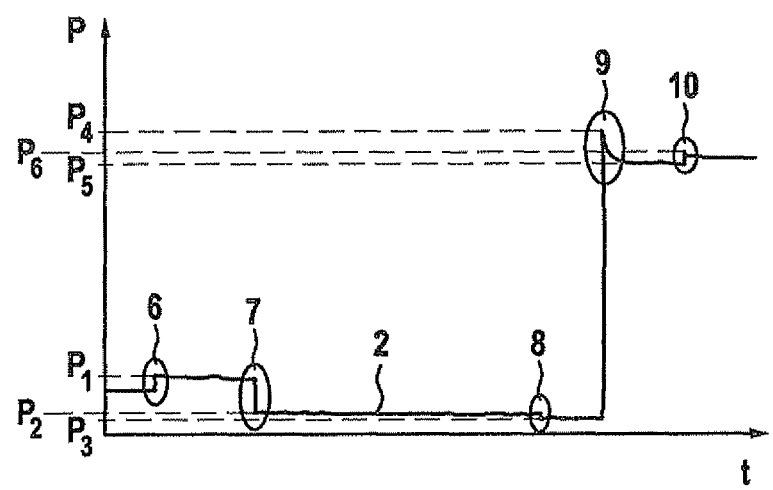
FIG. 2 shows an illustration of the power consumption of typical electric consumers when these are connected and disconnected.

In FIG. 2, curve 2 shows power consumption P of electrical consumers over time t, the electrical consumers being connected and disconnected individually. A characteristic curve 2 is drawn for each connection and disconnection of a consumer, which is recognized with the aid of the method to be described in greater detail below, and thus a specific consumer may be associated with each connection and disconnection. Thus, in first region 6 of curve 2, the connection of a fan is recognizable, which is characterized by a typical, almost vertical increase in power consumption P to a value $P_1$. Later, in a second region 7, the disconnection of a refrigerator is recognizable, which also results in a typical power behavior, namely a typical power drop in the network to a value $P_2$. In a third region 8, the reduction of the fan power from a first, relatively high power to a reduced operation can be seen, which is reflected in a slight decrease in the power consumption of the network to the value $P_3$. In a further region 9, the sudden increase in power consumption P to value $P_4$ is noticeable, caused by connecting a toaster. It may be furthermore seen that after connecting the toaster, power consumption P decreases via a characteristically descending curve to the value $P_5$. Finally, in a fifth region 10, an increase in power consumption P to the value $P_6$ may be seen, and shortly thereafter a drop in power consumption P, which is characteristic for the connection of a light.

Thus, it is apparent from FIG. 2 that for each connection and disconnection process of an electric consumer, a characteristic shape of curve 2 of power consumption P is detected, which is to be recognized with the aid of the method according to the present invention and associated with the specific consumer.

For elucidating the method according to the present invention, reference is now made to FIG. 3, which schematically represents an electrical network 100 overall. Electric network 100 is, in particular an electric network 100 within a spatially limited area, for example within a house or a factory building. Electric network 100 has, for example, four consumers 12 through 15, which are supplied with voltage or current via lines 16 through 19. It is furthermore characteristic that each of lines 16 through 19 has a characteristic length with respect to the distance to a current distributor 20, designed as a measured value recording device, dependent in particular on the location of consumer 12 through 15. A central control unit 21, which detects, in particular the connection processes of individual consumers 12 through 15, is connected to current distributor 20. The individual connection processes may be detected here by detecting the power consumption or the total power at current distributor 20 according to FIGS. 1 and 2.

Central control unit 21 is coupled to an optional input/output unit 25 via a line 22. Input/output unit 25 includes in particular an input keyboard (not illustrated) and output options in the form, for example of a screen or another suitable device, which represents and documents the measured values detected by central control unit 21. Optionally, connection and disconnection profiles are additionally stored in central control unit 21 for the connection and disconnection processes of consumers 12 through 15. The connection and disconnection profiles may also be transmitted by other means (for example wirelessly).

In the flow chart of FIG. 4, a measured value, for example, an electric power P, is illustrated as input variable, which is supplied to central control unit 21. In a first branch 26 of the flow chart, connection of one of consumers 12 through 15 is identified via first method step 27.

In a second method step 28, the power consumption of consumer 12 through 15 is measured, i.e., its time curve is drawn with the help of a connection profile. In a second branch 31, parallel to first branch 26, disconnection of one of consumers 12 through 15 is recognized in a first method step 27a. Also in a second method step 28a, the time curve of the power consumption of electric network 100 is recorded, so that a disconnection profile of consumer 12 through 15 is ascertained.

The results of second method steps 28 and 28a, i.e., the ascertained connection profile and disconnection profile of consumers 12 through 15 is then compared, in a further, third method step 35, with the connection profiles and disconnection profiles of consumers 12 through 15 stored in central control unit 21, so a conclusion may be drawn regarding a specific consumer 12 through 15 from the ascertained connection profile and disconnection profile. Should this not be directly possible, the actually recorded connection profile and disconnection profile (or, alternatively, the stored connection profiles and disconnection profiles) are modified in a fourth method step 36 in such a way that different lengths L of lines 16 through 19 are simulated. The now modified connection profiles and disconnection profiles possibly lead directly to a specific consumer 12 through 15. This is possible in particular if characteristic connection profiles and disconnection profiles of consumers 12 through 15 are stored in advance via input/output unit 25. This is furthermore facilitated if, before the initial operation of electric network 100, connection and disconnection are simulated with the aid of a calibrating device and a known distance between the calibrating device and central control unit 21 to thus store measured curves in central control unit 21, which facilitate the simulation of different lengths L of lines 16 through 19.

As the result of fourth method step 36, in a fifth method step 37 either specific consumer 12 through 15 is identified, or a suggestion is made regarding a specific device type or a specific distance of the device type from central control unit 21 which may be confirmed or rejected by an operator to thus identify or reject a specific consumer 12 through 15.

In a block 38, the results of the connection and disconnection processes of electric network 100 are processed, and pairings of the connection and disconnection processes and the resulting power-on times of consumers 12 through 15 are ascertained. The results (in particular list of the devices found, data for connecting and disconnecting the devices, device type, and distance) are represented with the aid of input/output unit 25 in a step 39. If necessary, it may be provided here that, in a step 40, central control unit 21 provides suggestions regarding suitable connection and disconnection processes and for energy optimization of consumers 12 through 15.

FIG. 5 illustrates the time curve of a measured value M as set directly on a consumer. A connection result 41 and a disconnection result 42 are illustrated, resulting in corresponding changes in measured value M. The consumer is energized between connection result 41 and disconnection result 42. Different curves of measured values $M_1$ and $M_2$ result as a function of different line lengths $L_1$ and $L_2$ between the consumer and, for example, central control unit 21. Thus it is apparent that for a longer line length $L_2$, the time curve of measured value $M_2$ is delayed. At the same time, also the curve of measured value $M_2$ is slightly modified compared to measured value $M_1$ for a small line length $L_1$. When different line lengths L are simulated, these findings are used for being able to simulate the detected connection and disconnection profiles using different line lengths L and thus for being able to draw a conclusion regarding a certain distance between a consumer (in particular a consumer 12 through 15) and central control unit 21.

In the description and the exemplary embodiment, an electric network 100 was assumed, i.e., that consumers 12 through 15 are electric consumers 12 through 15. However, within the scope of the present invention, instead of electric consumers 12 through 15, also pneumatic or hydraulic consumers may be recognized or located with the aid of the above-described method according to the present invention. It is also noted that, regarding the type of the measured value, all characteristic measured values for the particular consumer 12 through 15 are meaningful or conceivable for enabling an identification of consumer 12 through 15. In particular for pneumatic or hydraulic consumers, this may be, for example, the volume flow, the pneumatic or hydraulic pressure, or other measured values.

It is furthermore pointed out that the present invention has been presented and elucidated within the scope of consumers. However, the present invention is not limited to the identification of consumers, but may be also applied to the identification of producers and also includes pneumatic, hydraulic or electric networks in which there are both consumers and producers.

What is claimed is:

1. A method for identifying at least one of energy consumers and energy producers in one of a pneumatic, hydraulic, or electrical network which has a control unit, the method comprising:
   storing comparative profiles of the energy consumers and the energy producers in one of the control unit or a database;
   detecting, by the control unit, at least one of connection and disconnection processes of the at least one of the energy consumers and the energy producers;
   comparing the at least one of detected connection and disconnection processes with the stored comparative profiles; and
   associating the at least one of detected connection and disconnection processes with a selected one of the energy consumers and the energy producers with at least a specified level of probability based on the comparison;
   wherein during the at least one of the connection and disconnection processes of the at least one of the energy consumers and the energy producers, a time curve of a measured value is detected, and wherein a recording unit is provided and a conclusion is drawn regarding a spatial distance of the at least one of the energy consumers and the energy producers to the recording unit based on the time curve of the measured value.

2. The method as recited in claim 1, wherein the measured value includes one of a current, a voltage, a power consumption, a pneumatic pressure, a hydraulic pressure, or a volume flow.

3. The method as recited in claim 1, wherein, in the event of a deviation of the detected time curve of the measured value from time curves of the comparative profiles stored in the central control unit, the detected time curve is associated with the selected one of the energy consumers and the energy producers on the basis of specified probability criteria.

4. The method as recited in claim 1, wherein the detected time curve of the measured value is appended to the time curves of the comparative profiles stored in the control unit.

5. The method as recited in claim 3, wherein the control unit is coupled to at least one output unit which displays (i) at least the time curve of the measured value of the detected at least one of the connection and disconnection processes and (ii) the at least one of the energy consumers and the energy producers associated with the detected at least one of the connection and disconnection processes.

6. The method as recited in claim 1, wherein the stored comparative profiles include characteristic quantities of known energy consumers and energy producers are stored in the one of the control unit or the database via an input unit, and wherein the control unit performs the comparison of the detected time curve of the measured value associated with the at least one of the detected connection and disconnection processes with the stored comparative profiles to identify the selected one of the energy consumers and the energy producers.

7. The method as recited in claim 5, wherein in the presence of multiple possible energy consumers and energy producers associated with the detected time curve of the measured value, the control unit is configured to display the multiple possible energy consumers and energy producers, and wherein the detected time curve of the measured value is associated with the selected one of the energy consumers and the energy producers manually.

8. The method as recited in claim 5, wherein the control unit additionally outputs at least an optimization suggestion for minimizing the power consumption of the at least one of the energy consumers and the energy producers.

* * * * *